United States Patent [19]

Andresen

[11] Patent Number: 4,639,667

[45] Date of Patent: Jan. 27, 1987

[54] CONTACTLESS CONTROLLERS SENSING DISPLACEMENT ALONG TWO ORTHOGONAL DIRECTIONS BY THE OVERLAP OF A MAGNET AND SATURABLE CORES

[76] Inventor: Herman J. Andresen, 726 Carriage Hill, Glenview, Ill. 60025

[21] Appl. No.: 496,843

[22] Filed: May 23, 1983

[51] Int. Cl.[4] .................. G01B 7/14; G08C 19/06
[52] U.S. Cl. ..................... 324/208; 340/870.33
[58] Field of Search ............... 324/207, 208, 253–255; 336/45; 338/32 H, 33 R; 74/471 XY, 471 R; 340/870.31, 870.33, 870.35

[56] References Cited

U.S. PATENT DOCUMENTS

| | | | |
|---|---|---|---|
| 2,852,732 | 9/1958 | Weiss | 323/94 |
| 3,128,625 | 4/1964 | Heineman | 73/209 |
| 3,267,404 | 3/1964 | Hieronymus | 338/32 |
| 3,305,770 | 2/1967 | Hulls | 338/32 |
| 3,331,972 | 7/1967 | Moller | 338/32 H |
| 3,395,341 | 7/1968 | Malaquin | 324/70 |
| 3,421,227 | 1/1969 | Turner et al. | 324/207 |
| 3,462,673 | 8/1969 | Hieronymus | 323/69 |
| 3,474,332 | 10/1969 | Brown | 324/34 |
| 3,691,502 | 9/1972 | Kataoka | 338/32 |
| 3,698,531 | 10/1972 | Bernin | 197/98 |
| 3,718,872 | 6/1971 | Takeuchi | 332/51 R |
| 3,753,202 | 6/1972 | Kataoka et al. | 338/32 H |
| 3,818,326 | 6/1974 | Masuda et al. | 324/34 PS |
| 3,958,202 | 5/1976 | Sidor | 336/110 |
| 3,958,203 | 5/1976 | Bernin | 336/110 |
| 3,988,710 | 10/1976 | Sidor et al. | 338/32 R |
| 4,088,977 | 5/1978 | Bowman, Jr. et al. | 338/32 |
| 4,121,185 | 10/1978 | Genz | 336/110 |
| 4,137,512 | 1/1979 | Sidor | 335/206 |
| 4,229,993 | 10/1980 | Andresen | 74/538 |
| 4,332,177 | 6/1982 | Andresen | 74/491 |
| 4,459,578 | 7/1984 | Sava et al. | 330/32 H |

OTHER PUBLICATIONS

Licon Product Bulletin PS-1000, Series 33 Position Sensors and Signal Conditioner (Illinois Tool Works, 1979) (4 pages).
Monsun-Tison Brochure (8 pages).

Primary Examiner—Ernest F. Karlsen
Assistant Examiner—Walter E. Snow
Attorney, Agent, or Firm—Leydig, Voit & Mayer

[57] ABSTRACT

A multi-directional contactless controller senses the displacement of a manipulator with respect to a reference frame along two orthogonal directions and also indicates rotation of the manipulator with respect to the reference frame. The manipulator is journaled to a carrier and means are provided for preventing rotation of the carrier with respect to the reference frame. A rotary-type sensor indicates the rotation of the manipulator with respect to the carrier. Contactless linear sensors indicate the displacement of the carrier with respect to the reference frame. In one preferred embodiment, the carrier is planar and carries a square flat magnet which differentially saturates two pairs of saturable cores secured to the reference frame. In a second embodiment, the carrier is cylindrical and telescopes within a cylindrical frame. In a third embodiment, the carrier is spherical and is received in a ball-and-socket type joint fashioned in the reference frame. A contactless controller is also disclosed having the polarity of the indication for a first direction of control selected by a second direction of control, the first direction of control providing a linear response and the second direction of control providing a nonlinear response.

6 Claims, 14 Drawing Figures

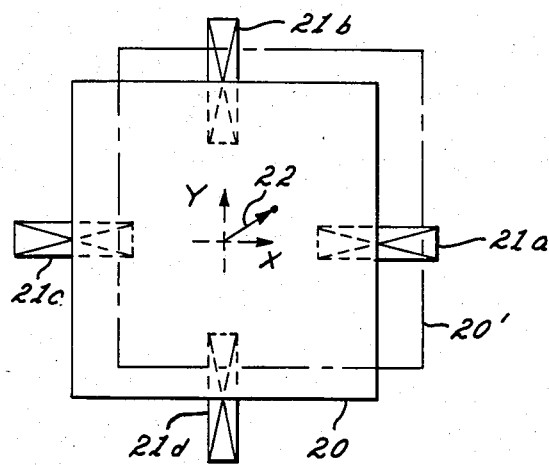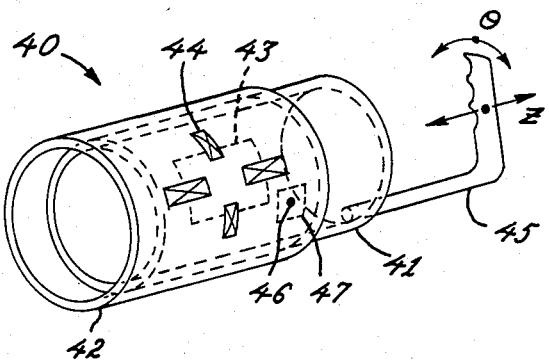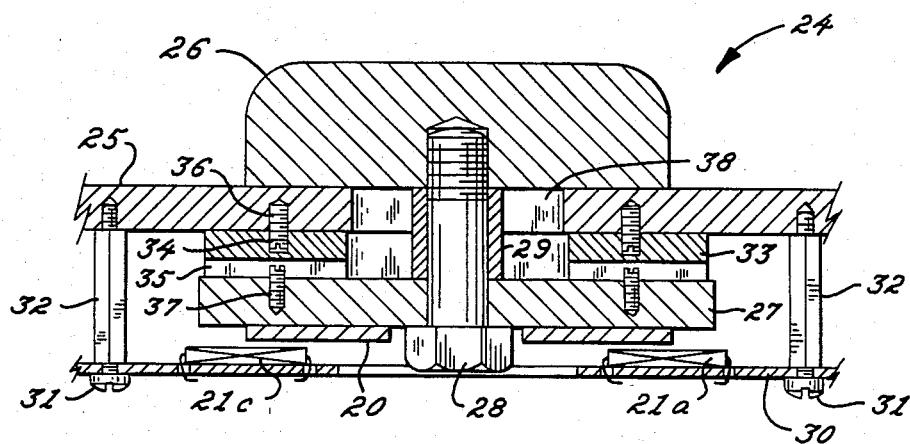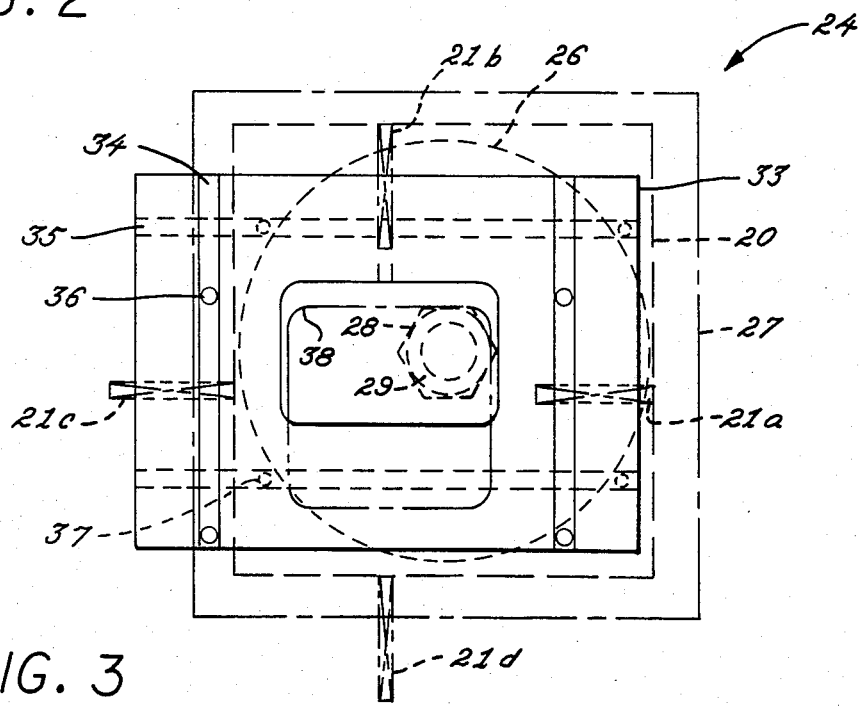

CONTACTLESS CONTROLLERS SENSING DISPLACEMENT ALONG TWO ORTHOGONAL DIRECTIONS BY THE OVERLAP OF A MAGNET AND SATURABLE CORES

BACKGROUND OF THE INVENTION

The present invention relates to the field of contactless controllers wherein the displacement of a carrier with respect to a reference frame is sensed without requiring an electrical contact between the carrier and reference frame. Controllers find application in such diverse areas as construction and agricultural vehicles, video games, computer graphics, robotics, and remote control. The controller serves as an interface between a human being and a computer or control system. The controller generates electrical signals in response to being manipulated by the user.

One convenient method of contactless sensing uses a magnet to establish a magnetic field and the displacement of the magnet with respect to a magnetically saturable core is sensed by the proportional part of the core which is saturated. Once saturation of a part of the core is achieved, any variation in the strength of the magnetic field is inconsequential. This principle has been applied to rotary and linear displacement sensors. A somewhat similar scheme senses the displacement of a magnet with respect to a semiconductor element exhibiting a magnetoresistive effect. The relative change in resistance of the semiconductor element is limited by the magnetic field strengths attainable with currently available magnets, however, and the response of the element is nonlinear and never achieves saturation. Thus, a magnetoresistive sensor is always responsive to variations in the magnetic field strength such as are caused by temperature variations, gap variations, and aging as well as changes due to displacement of the magnet. Kataoka et al. U.S. Pat. No. 3,691,502 issued Sept. 12, 1972 discloses that it is possible to obtain a device of this sort for detecting two-dimensional displacement by assembling two perpendicularly combined magnetoresistive devices. See FIGS. 33, 34. In FIG. 34, the magnetic field is of square shape having a central square space and takes a symetrical position over the magnetoresistive devices in the case of zero displacement. It is said that the voltages produced at center terminals independently measure the displacement in the orthogonal directions because the portions applied with magnetic field along one orthogonal direction are not changed by the displacement of the magnetic field in the other orthogonal direction. See Column 11, line 37-Column 12, line 27. Kataoka et al. further describe their magnetoresistive devices in U.S. Pat. No. 3,753,202 issued Aug. 14, 1973.

SUMMARY OF THE INVENTION

The general aim of the present invention is to provide multi-directional contactless controllers that are rugged, reliable, and economical to manufacture.

Another object of the present invention is to provide a contactless controller having at least three axes or orthogonal directions of control.

Yet another object is to provide a multi-directional controller having a minimum number of moving parts.

Moreover, an object of the invention is to provide a multi-directional controller having excellent linearity and stable characteristics over a wide temperature range and throughout an extended operating lifetime.

And yet another object is to provide a controller sensing and indicating cylindrical and spherical coordinate positions.

Still another object of the present invention is to provide a contactless controller having the polarity of the indication for one direction of control selected by another direction of control.

In accordance with the invention, contactless sensors are responsive to the displacement of a carrier with respect to a reference frame in two generally orthogonal directions, thereby eliminating the need for mechanical components to resolve the displacement of the carrier into independent orthogonal linear displacements. By eliminating these mechanical components, a multi-directional controller can be manufactured with only one moving part. The carrier and frame can be made having planar, cylindrical or spherical geometries. Moreover, in the planar or spherical case, simple guiding means are disclosed for preventing rotation of the carrier with respect to the frame about an axis, so that rotation of the manipulator with respect to the axis may be sensed to provide a third direction or axis of control. Also, an embodiment having a nonlinear response with respect to one direction is disclosed in which motion in one direction reverses the polarity of the sensing of motion in another direction.

BRIEF DESCRIPTION OF THE DRAWINGS

Other objects and advantages of the present invention will become apparent upon reference to the drawings, in which:

FIG. 1 is a pictorial plan view of a carrier and sensor arrangement having a generally square magnet;

FIG. 2 is a cross-sectional elevation of a planar geometry embodiment of a multi-directional contactless controller using the magnet and sensor geometry shown in FIG. 1;

FIG. 3 is a plan view of the guiding means in the planar embodiment of FIG. 2, the other components being shown in phantom lines to illustrate the positions of the manipulator, carrier, and guide with respect to the frame when the manipulator and carrier assumes its extreme upper right position;

FIG. 4 is a pictorial diagram, in perspective, illustrating a cylindrical embodiment of the invention;

Figure 5:
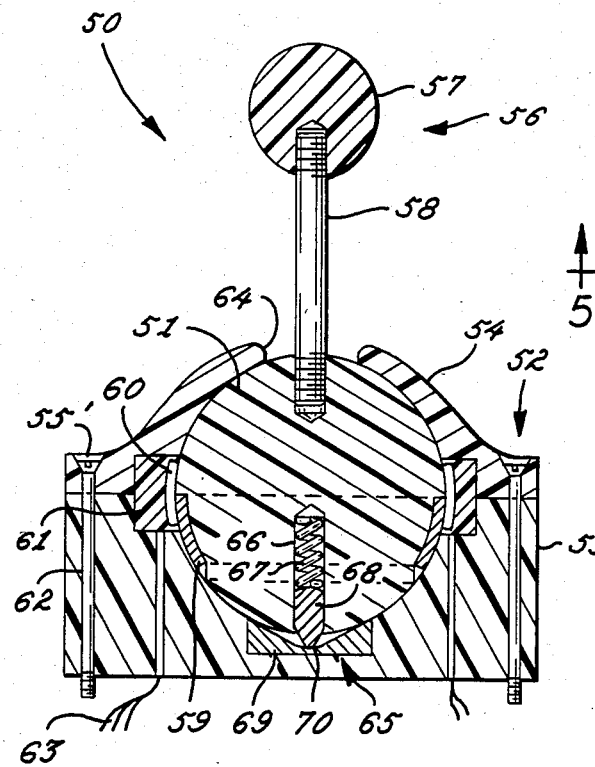
FIG. 5 is a cross-sectional elevation view of a spherical "joystick" embodiment of the present invention along section line 5—5 of FIG. 6.
Figure 6:
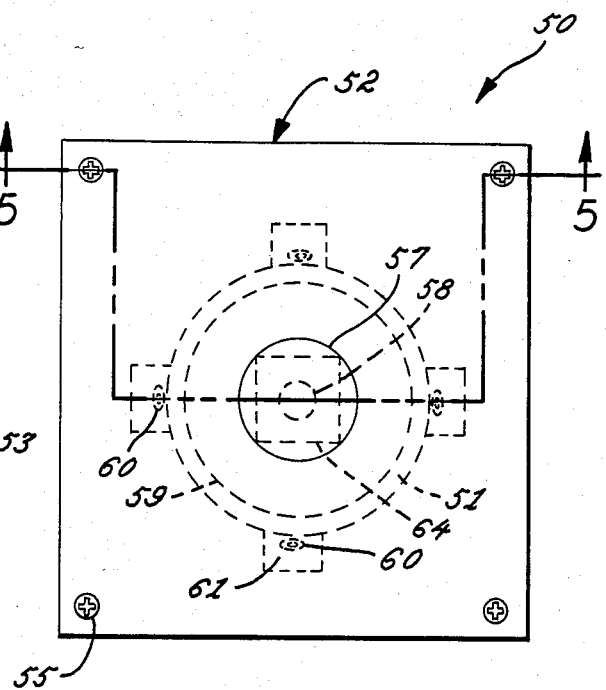
FIG. 6 is a plan view of the joystick shown in FIG. 5.

While the invention has been described in connection with certain preferred embodiments, it will be understood that there is no intention to limit the invention to the particular embodiments which have been illustrated, but it has been intended, on the contrary, to cover the various alternative and equivalent forms of the invention included within the spirit and scope of the appended claims.

DESCRIPTION OF THE PREFERRED EMBODIMENTS

Turning now to the drawings there shown in FIG. 1 a square magnet 20 presumably mounted on a carrier, the magnet having edge portions overlapping four magnetically saturable cores 21a, 21b, 21c, 21d, which are presumed to be secured to a reference frame. The portions of the cores 21a-21d shown in dashed representation are overlapped by the magnet 20 and become saturated by the magnetic field emitted from the magnet 20. Electrical circuits (shown below in FIGS. 7A, 7B) can detect the differential overlap of the magnet 20 with the pairs of opposite cores (21a, 21c) and (21b, 21d) with a high degree of precision and linearity. The relative position of the magnet is sensed with infinite resolution and independent of the spacing or gap between the plane of the magnet 20 and the plane of the cores 21a-21d. With the magnet 20 as shown, the cores 21a-21d are all saturated in half of their entirety giving rise to a null condition in both the X and Y directions. It is readily appreciated, however, that an X displacement will differentially change the portions of the cores 21a, 21c which are saturated without changing the differential saturated portions of the cores 21b, 21d. Similarly, a displacement of the magnet 20 in the Y direction will cause a proportionate differential saturation of the cores 21b, 21d without affecting the differentially saturated portions of the cores 21a, 21c. Thus, the differential saturation of the cores 21a, 21c independently give an indication of the X displacement of the magnet 20, while the cores 21b, 21d independently sense the displacement of the magnet 20 in the Y direction. Hence, if the magnet 20 is displaced to an arbitrary location such as the location 20', the X and Y coordinates of the displacement 22 are independently sensed.

FIG. 1 describes in theoretical terms the operation of a multi-directional contactless controller sensing the displacement of the magnet 20 in two orthogonal directions. In practice, however, additional means are required for constraining the motion of the magnet 20 along the two orthogonal directions and for preventing rotation of the magnet 20 with respect to the saturable cores. It should be noted, however, that in some applications such as video games, the sensing of the X and Y displacements need not be entirely independent. In this case, the magnet 20 could be of circular shape so that rotation of the magnet 20 with respect to the cores 21a-d is inconsequential and need not be prevented. Moreover, if the output of such a controller is converted to digital form, a numerical correction could remove the dependency of the indicated displacements ($X_o$, $Y_o$) to obtain relatively independent displacements ($X'$, $Y'$). An exemplary mathematical formula for an approximate numerical correction is:

$$X' = X_o(1 - aY_o^2)$$

$$Y' = Y_o(1 - aX_o^2)$$

where the predetermined constant $a$ is selected to cancel the X-Y dependency. The required correction is relatively small due to the fact that the pairs of cores sense differential saturation so that the dependencies of the two cores in each pair partially cancel.

To constrain motion of the magnet 20 along first and second orthogonal directions thereby preventing movement of the magnet in the third orthogonal direction, carrier means are provided having planar, cylindrical, or spherical geometry. A controller generally designated 24 having a planar geometry is shown in FIG. 2. Exposed to the user are a plate 25 providing the surface of a control console and a hockey-puck type manipulator 26 which may be moved in the X and Y directions with respect to the plane of the plate 25. On the underside of the plate 25 and thus shielded from the user, the magnet 20 is securely fixed to a square carrier 27. A bolt 28 securely attaches the manipulator 26 to the carrier 27 and a cylindrical bushing 29 prevents the bolt 28 from clamping the manipulator 20 to the plate 25. The saturable cores 21a-d are secured to a printed circuit board 30 screwed to the underside of the plate 25 via screws 31 and stand-offs 32. The plate 25, in other words, establishes a reference frame about which the displacement of the carrier 27 is sensed. The manipulator 26 provides a means for the operator or user to adjust the position of the carrier 27 with respect to the reference frame. It should be noted that there is no electrical contact between the magnet 20 and the saturable cores 21; in fact, there is no physical contact. For the purpose of interpreting the claims, by "contactless" it is meant that relative position is sensed by means other than an electrical contact or connection. The advantage of a "contactless" controller is that, unlike a conventional potentiometer, the response of the sensor is insensitive to the condition of the interface between the moving parts. In FIG. 2, the complete separation between the magnet 20 and the saturable cores 21a-d facilitates assembly of the controller 24. The saturable cores 21a-d, for example, could be mounted on the same printed circuit board 30 upon which the video game circuits are mounted. Thus, there is no labor involved in connecting the multi-directional contactless controller 24 to the video game circuits.

For linear and independent displacement sensing in the X and Y directions, the magnet 20 should be square rather than circular and means are required for preventing rotation of the carrier 27 with respect to the reference frame or plate 25. For this purpose, a guide plate 33 is inserted between the carrier 27 and the plate 25. As shown in FIG. 3, the guide plate 33 has two upper grooves or slots 34 along the Y direction and two lower grooves 35 in the X direction. The upper grooves 34 engage with four set screws 36 threaded in and depending from the underside of the reference frame or plate 25 and the lower grooves 35 engage with four set screws 37 threaded into the carrier 27. The upper slots 34 and set screws 36 constrain displacement of the guide plate 33 to along the Y direction with respect to the reference frame 25, and further prevent rotation of the guide plate 33 with respect to the reference frame 25. The lower grooves 35 and set screws 37 permit the carrier 27 to move only in the X direction with respect to the guide plate 33, thereby permitting the carrier 27 to move in both the X and Y directions with respect to the reference frame or plate 25, but preventing rotation of the carrier 27 with respect to the guide plate 33 and thus also with respect to the reference frame or plate 25.

FIG. 3 shows, in phantom lines, the positions of the components for the planar geometry controller 24 when the manipulator 26 is displaced to the upper right-hand corner limit position. It should be noted that at this limit position the cores 21a, 21b in the positive X and Y directions, respectively, just become saturated in their entirety, and the cores 21c and 21d, in the negative X and Y directions, respectively, just become unsaturated in their entirety by the magnetic field of the magnet 20. The X and Y limit positions are defined by contact of the outer circumference of the bushing 29 with a generally square aperture 38 punched or milled in the reference plate 25.

Turning now to FIG. 4, there is shown a cylindrical geometry controller generally designated 40 having a cylindrical carrier 41 telescopingly received in a cylindrical frame 42. A square or rectangular magnet 43 has edges aligned with the axial Z and circumferential $\theta$ directions of the cylinder of the carrier 41. The magnet 43 is shown fixed to the carrier 41 and the saturable cores 44 are shown fixed to the frame 42. The cores 44, for example, are received into apertures milled into the frame 42 and secured there by an adhesive or potting compound such as epoxy. The magnet 43, for example, is also received in a milled in or turned down portion of the carrier 41 and glued in place. The relation between the carrier 43 and saturable cores 44 is similar to the arrangement shown in FIG. 1, it being understood that the geometry of FIG. 1 is merely distorted by aligning the X direction in FIG. 1 with the Z direction of FIG. 4, and bending the plane of FIG. 1 so that the Y direction of FIG. 1 corresponds to the $\theta$ direction of FIG. 4. A manipulator 45 having a handlebar-type grip is attached to the carrier 41. An aperture 47 is milled into the carrier 41 to receive a pin or bolt 46 screwed into and inwardly extending from the reference frame 42 so as to define the limit positions in the Z and $\theta$ directions of the carrier 41 with respect to the frame 42. The pin 46 and aperture 47, in other words, performs the same function as the aperture 38 and bushing 29 in FIG. 3. It should be noted that unlike the planar configuration 24 in FIGS. 2 and 3, the cylindrical embodiment 40 in FIG. 4 inherently prevents rotation of the carrier 41 with respect to the frame 42 about any radial axis.

Shown in FIG. 5 is a multi-directional contactless controller 50 having a spherical geometry. A spherical carrier is received in a generally spherical reference frame generally designated 52, having a bottom part 53 and a top part 54 making up a socket which receives the carrier 51. Four machine screws 55 are shown for securing the controller 50 to a control panel (not shown). A manipulator generally designated 56 is comprised of a palm rest 57 and a threaded shaft 58 fixing the palm rest 57 to the carrier 51. Thus, the manipulator 56 may be used to pivot the carrier 51 about its center along two orthogonal directions, for example, forward-and-back and side-to-side (designating the directions of displacement of the palm rest 57), as well as in any orbicular pattern within established limits.

An annular magnet 59 corresponding to part of a hemisphere is received in and secured to the carrier 51. The magnet 59 differentially saturates diametrically opposed pairs of saturable cores 60 at 90° locations about the axis of the shaft 58 when the shaft 58 is vertical. When the shaft 58 is vertical, one half of each of the cores 60 is saturated by the hemispherical edge portion of the annular magnet 59. The pairs of diametrically opposite cores 60 become differentially saturated, however, when the manipulator 56 tilts forward-andback or side-to-side. It is evident, from the radial symmetry of the hemispherical edge portion of the magnet 59, that the differential saturation of the pairs of cores 60 independently senses the forward-and-back, and side-to-side, displacement of the manipulator 56 regardless of any rotation of the carrier 51 about the axis of the shaft 58. The cores 60 have a slightly bent shape conforming to the curvature of the spherical carrier 51. For small scale production, the curved cores 60 are conveniently fabricated by winding a strip of permeable metal such as mu-metal about a bent wire or other curved preform, or by bending mu-metal tubes or soft ferrite cores. The cores 60 are glued, potted or molded into holders 61 which are clamped between the lower 53 and upper 54 parts of the frame 52. Bores 62 provide access for sensing wires 63 to the cores 60.

The limit of travel of the carrier 51 with respect to the frame 52 is defined by an aperture 64 in the upper part of the frame 52. The spherical embodiment 50 also has springbiased means generally designated 65 for asserting an impeding force on the manipulator 57 with respect to the frame 52 over the permitted range of travel of the carrier 51. A bore 66 receives a spring 67 for biasing a cam follower 68 against a cam 69. The surface of the cam 69 is generally conical to provide a net torque on the carrier 51 tending to restore the manipulator 56 to its center vertical position. The cam 69 is preferably fashioned with a central detent 70 for providing a repetitively uniform center position and some locking force, and may also have detents or channels to define preferred positions or preferred directions of movement for the manipulator 56. The surface of the cam 69 may be "programmed," by selecting the cam surface to provide any desired impeding force or self-actuating force on the manipulator 56 as a function of the displacement of the carrier 51 with respect to the reference frame 52 in both the front-to-back and side-to-side directions of motion of the manipulator.

Figure 7A:
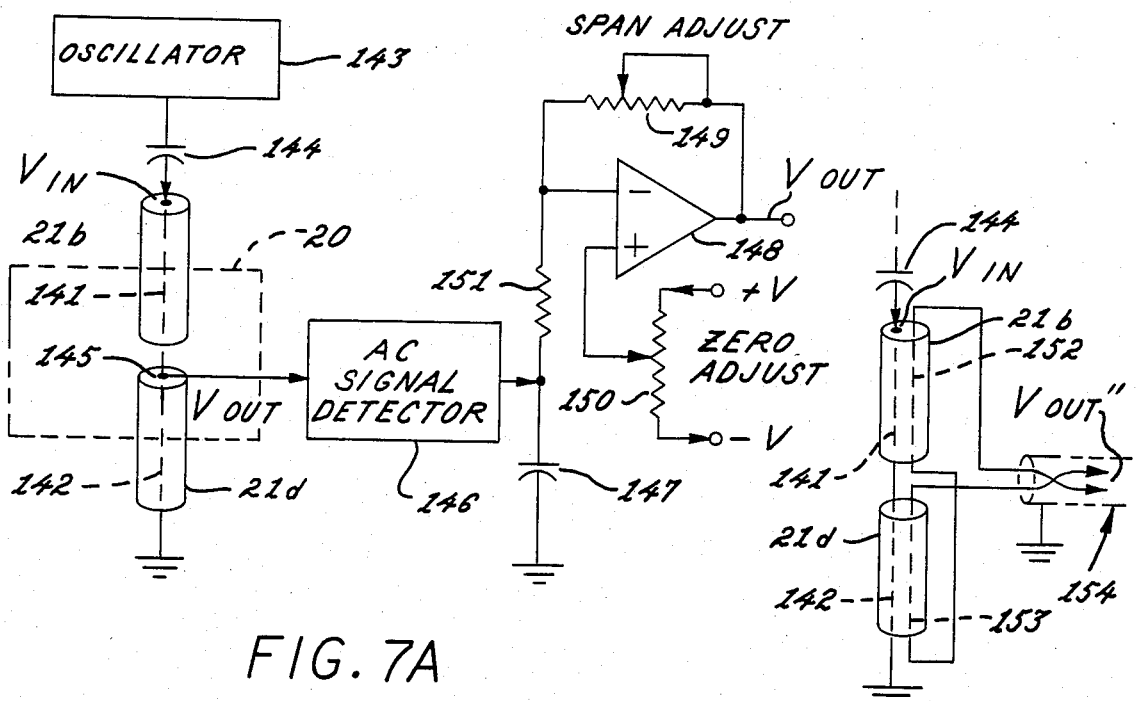
FIGS. 7A and 7B are rudimentary circuit diagrams for converting the differential saturation of two cores to a usable output signal.
Figure 7B:

Now that planar 24, cylindrical 40, and spherical 50 embodiments of a bi-directional controller have been disclosed, the circuitry shown in FIG. 7A and FIG. 7B for converting the differential saturation of the cores to a useful electrical indication will be described. It should be noted, however, that the general problem of converting differential saturation of the cores to an output voltage has been solved in the prior art for contactless controllers sensing a single linear or rotary displacement. Thus, for each orthogonal direction of motion to be detected, an electrical circuit of known construction may be used. Preferred circuits are shown in FIG. 7A and FIG. 7B. The magnet material used for the magnet 20 is a staple of commerce consisting of a flexible sheet of plastic loaded with particles of barium ferrite or equivalent. The material comes in various thicknesses and may be cut to a desired shape following which it may be permanently magnetized. The material is available as a staple of commerce from a number of different sources including 3M Company, Industrial Electrical Products Division, 3M Center, St. Paul, Minn. 55101 or from Bunting Magnetics Co., 500 South Spencer Ave., Newton, Kans. 67114. The saturable cores 21b, 21d are also a staple of commerce. Soft ferrite cores may be obtained from Indiana General, Valparaiso, Ind. 46383, Stackpole Company, St. Mary's, Pa. 15857, or Ceramic Magnetics Inc., Fairfield, N.J. 07006. Mu-metal is available from Mu Shield Co., Malden, Mass. 02148 and Carpenter Technology Corp., Reading, Pa. 19603.

As shown in FIG. 7A, the saturable cores $21b$, $21d$ are tubular and are threaded with one or more "pickup" turns 141, 142 which sense the differential saturation of the tubes $21b$, $21d$. An oscillator 143 generates an excitation signal of about one kilohertz which is coupled to the pickup turns 141, 142 by a capacitor 144. As shown, the excitation $V_{in}$ is applied across the pickup turns 141, 142 connected in series with respect to ground. An output signal $V_{out}$ appears at the midpoint or tap 145 connecting the pickup turns 141, 142. Since the pickup turns 141, 142 constitute the two impedances of a voltage divider, the output and excitation signals are related to the fractional inductance $\alpha$ (of the lower tube $21d$) and the non-saturated self-inductance L according to:

$$\frac{V_{out}}{V_{in}} = \frac{\alpha L}{L + (1 - \alpha)L} = \alpha$$

The fractional inductance $\alpha$ is one-half for the middle position of the magnet 20 as shown. The self-inductance of the lower tube $21d$ is $\alpha L$ and the self-inductance of the upper tube $21b$ is $(1-\alpha)L$. In other words, $\alpha$ is an indication of the proportional part of each core that is saturated or unsaturated, and therefore senses the relative displacement of the magnet 20 with respect to the cores $20b$, $20d$. Hence, the amplitude of the output signal $V_{out}$ is a linear function of the fractional inductance $\alpha$ and thus the relative difference in saturated volume of material between the two cores $21b$, $21d$, compared to total volume, referred to as "differential saturation" herein. Thus, the differential saturation is equal to $\alpha - \frac{1}{2}$, having a value of zero at the null position and limits of $+\frac{1}{2}$ or $-\frac{1}{2}$ at extreme positions of relative displacement of the magnet 20 with respect to the cores $20b$, $20d$.

In order to generate a DC electrical control signal $V_{out}'$ from the AC output signal $V_{out}$, an AC signal detector 146 generates a DC signal proportional to AC amplitude. A directional diode, for example, may be used, although more precise amplitude or peak detectors are available as integrated circuits. A signal conditioning chip, Part No. 80330057 manufactured by Interdesign Corp., is especially useful since it includes an oscillator as well as a peak detector. A demodulation or low-pass filter capacitor 147 shunts the AC signal detector 146 output to ground.

In order to independently adjust the span or range of DC signal $V_{out}'$, for a given position deviation of the magnet 20, and the zero point of the DC signal $V_{out}'$, a buffer amplifier 148 is provided having independent gain and offset controls 149, 150, respectively. The gain of the operational amplifier 148 is set by the resistance ratio of the adjustable resistor 149 and a series input resistor 151. The potentiometer 150 selects the zero or bias point of the amplifier 148 as a point between the positive +V and negative −V supply voltages.

During an initial calibration step, the span adjust control 149 is set midrange and the magnet 20 is placed in the desired center reference position. Then the zero adjust control 150 is adjusted to obtain a zero output voltage $V_{out}'$ with respect to ground. Finally, the magnet 20 is moved along the axis of the tubes $21b$, $21d$ to a full-scale position, and the span adjust control 149 is adjusted for the desired fullscale voltage $V_{out}'$ with respect to ground.

In FIG. 7A the saturable cores or tubes are wired as inductors with single drive and pickup coils $21b$, $21d$ to sense differential self-inductance. Alternatively, as shown in FIG. 7B, secondary or sense coils 152, 153, respectively, may also be wound to sense the differential mutual inductance of the tubes. In this manner, the saturable tubes $21b$, $21d$ and coils 141, 142, 152, 153 comprise a differential transformer which generates a balanced output signal $V_{out}''$. The amplitude of the balanced output $V_{out}''$ is proportional to the axial displacement of the magnet 20 from the center reference position, while the phase or polarity of the output signal $V_{out}''$ is indicative of the particular direction from the center reference position. The differential connection of FIG. 7B has noise and interference rejection advantages over the single-ended connection of FIG. 7A, but it requires a balanced product detector (e.g., diode ring or switching demodulator such as IC Part No. 4016) for the AC signal detector 146 in order to compare the phase of the AC output signal $V_{out}''$ to the phase of the oscillator 143 output. But the balanced circuit of FIG. 7B is conveniently used for remote control, since a shielded twisted pair signal cable 154 provides excellent isolation from external electromagnetic interference.

Figures 8A, 8B, 9:
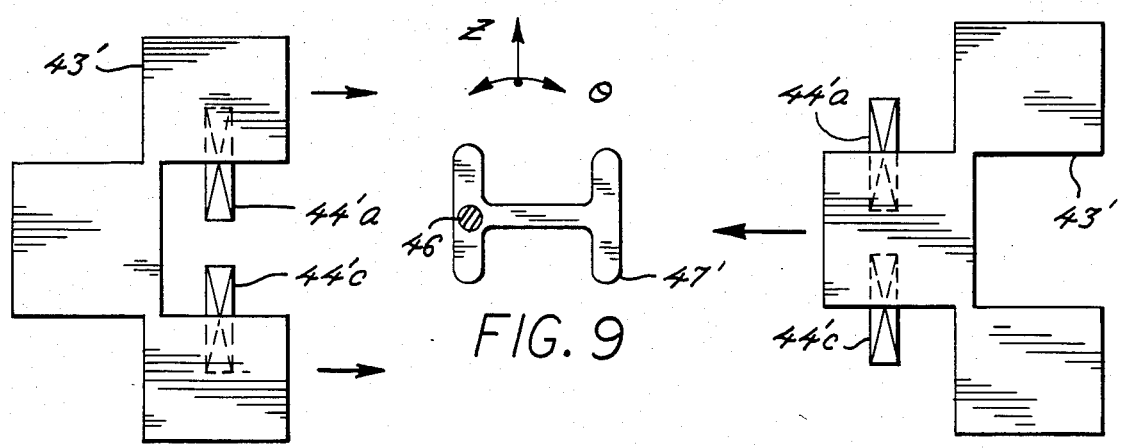
FIGS. 8A and 8B are pictorial diagrams illustrating the magnet and sensor geometry for providing a contactless controller which has a linear output in one direction, the polarity of the output being switched in response to motion in a second orthogonal direction.
FIG. 9 is a pictorial diagram of a guiding slot and guide pin, in cross-section, used with the sensor geometry of FIGS. 8A and 8B to permit the switching of polarity only at the zero or null position.

In accordance with another feature of the present invention, the polarity of the indication for one direction of control is selected by another direction of control. Although this feature can be incorporated into both the planar geometry control 24 of FIG. 2 and the cylindrical geometry control 40 of FIG. 4, it is preferably incorporated into the cylindrical geometry control 40 so that the position of the manipulator 47 indicates the selection of the polarity. In any case, however, the magnet geometry of FIGS. 8A and 8B is preferably employed. Since the response is linear in only one direction, only one pair of cores $44'a$ and $44'c$ is required. The reference numerals correspond to the cylindrical geometry of FIG. 4, so that the response is linear in the Z direction. But due to the configuration of the magnet $43'$, an angular displacement of the carrier 41, resulting in a shift of the magnet 43 in the direction of the arrows, reverses the polarity of the displacement sensed by the saturable cores $44'a$, $44'c$ without altering the indicated magnitude of the displacement. By comparison of the relative positions of the magnet $43'$ and the cores $44'a$–$44'c$ in FIG. 8A versus FIG. 8B, it is observed that relative motion of the magnet $43'$ induced by rotation of the carrier 41 (FIG. 4) causes the previously saturated portions of the cores (i.e., the portions shown in dashed representation) to become unsaturated and the previously unsaturated portions of the cores to become saturated. Preferably means are provided for preventing polarity reversal when the displacement indicated by the saturable cores $44'a$, $44'c$ is substantial. As shown in FIG. 9, the limit stop aperture 47 of FIG. 4 is modified to conform to an "H" pattern $47'$ so that the pin 46 prevents the angular displacement of the magnet $43'$ from occurring unless the magnet $43'$ is in its null or center position along the Z direction. It should be noted that if the angular extent of the magnet $43'$ is approximately 360°, so that the left and right vertical sides of the bars of the "H" pattern $47'$ subtend 180°, then the handle of the manipulator 45 is inverted between the two polarity positions of FIG. 8A and FIG. 8B. Thus, when the handle 47 is in its right side up position, the polarity may be chosen positive, and when the handle is in its upside down position, the polarity of the displacement sensed by the cores 44'a–c, will be negative. If the limit stop has the "H" pattern 47', the handle 47 is locked into either the rightside up or upside down position when the handle 47 is actuated or displaced along the Z direction away from the null position.

In accordance with another feature of the invention, the manipulator means is flexibly connected to the carrier for relative motion with respect to the carrier in a direction different than the first and second orthogonal directions sensed by the multi-directional controllers of FIGS. 2–6, and means are further provided for sensing the relative motion of the manipulator with respect to the carrier. In other words, it is possible to modify the controllers of FIGS. 2–6 in order to provide at least three axes or directions of control. In one embodiment, the manipulator comprises a "squeeze" type manipulator shown in FIGS. 20, 24, 25, and 26 of U.S. Pat. No. 4,332,177 and as described beginning in Column 11, line 3, herein incorporated by reference. In another embodiment, the joystick controller of FIG. 5 is attached via the screws 55 to the hockey-puck manipulator 26 of FIG. 2 in order to provide a four axis control. Electrical connections from the joystick control FIG. 5 to the underside of the plate 25 of the control panel is provided, for example, by a central bore through the bolt 28. In this embodiment it is preferable to use a grip or handlebar type manipulator as shown in FIG. 4 instead of the palm rest manipulator 57 shown in FIG. 5. In other words, the operator must get a firm grip on the manipulator 56 in order to adjust the tilt of the stick 56 sensed by the spherical controller 50 independent of the translation of the stick in the X and Y directions which is sensed by the planar geometry controller 24 of FIG. 2.

Figure 10:
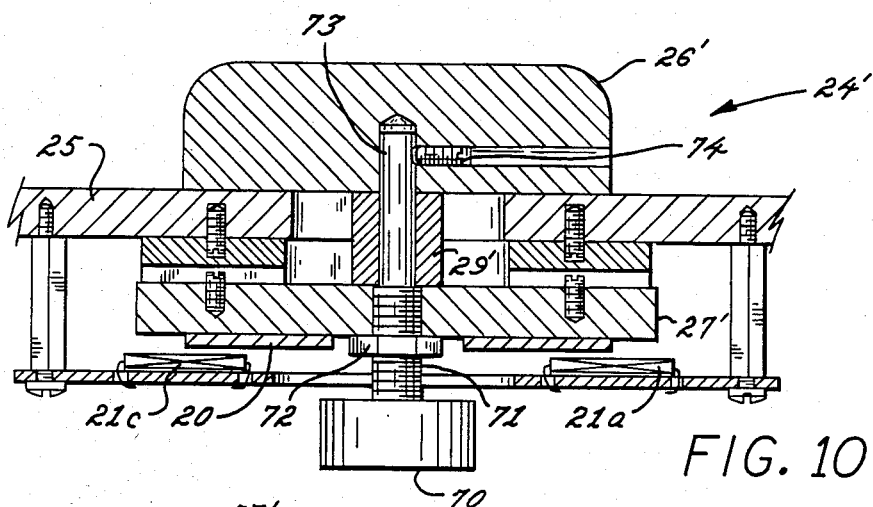
FIG. 10 is an elevation view, in cross-section, showing the modification of the two-axis controller of FIG. 2 to make a three-axis controller.
Figures 11, 12:
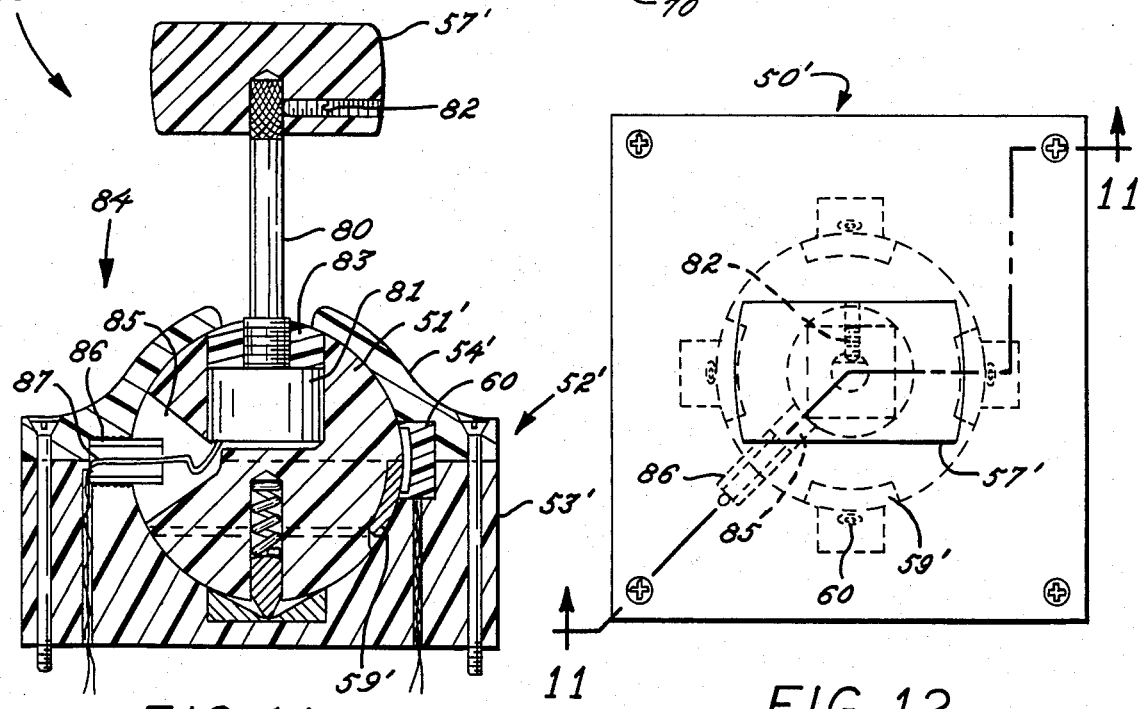
FIG. 11 is a cross-sectional elevation view along section line 11—11 in FIG. 12 showing how to modify the joystick controller of FIG. 5 to sense movement about three axes.
FIG. 12 is a plan view of the three-axis controller of FIG. 11.

Embodiments of three-axis controllers are shown in FIG. 10, FIG. 11 and FIG. 12. For the planar geometry of FIG. 10, the two-axis controller 24 of FIG. 2 is easily converted to the three-axis controller 24' of FIG. 10 by journaling the manipulator 26' to the carrier 27' via a rotary-type control 70. For low-cost applications the rotary control 70 is merely a potentiometer, although preferably it is a contactless rotary control such as is described in Bowman, Jr. et al., U.S. Pat. No. 4,088,977 issued May 9, 1978. The body of the rotary control 70 is firmly attached to the carrier 27 by its threaded extension 71 and a jam nut 72. The manipulator 26' is secured to the shaft 73 of the control 70 via a set screw 74. A bushing 29' is used with an inside diameter slightly greater than the diameter of the shaft 73.

Shown in FIG. 11 is a spherical geometry controller 50' responsive to three directions of control. The manipulator 57' is journaled for rotation with respect to the carrier 51' by securing the manipulator 57' to the shaft 80 of a rotary control 81. A set screw 82 ensures that the manipulator 57' does not rotate with respect to the shaft 80. In contrast to the palm rest 57 in FIG. 5, the manipulator 57' is cylindrical so that it may be easily grasped and rotated by the user. The rotary control 81 is received in a bore in the carrier 51' and is sealed by suitable potting compound 83.

Means generally designated 84 are provided to prevent the carrier 51' from rotating with respect to the frame 52'. An arcuate slot 85 is provided in the carrier 51' to receive a tubular pin 86 having its axis along the radial direction of the sphere of the carrier 51'. The pin 86 is clamped between the lower part 53' and the upper part 54' of the frame 52', the pin 86 being knurled externally to be securely gripped by the lower and upper parts of the frame. The width of the arcuate groove 85 matches the outer diameter of the pin 86 so that any forward-and-back or side-to-side motion of the manipulator 57' causes either a rotation of the carrier 51' about the axis of the tubular pin 86, or in effect causes a circumferential displacement of the tube 86 within the arcuate slot 85 with respect to the carrier 51'. The tube 86, however, abuts against the opposing faces of the arcuate slot 85 to prevent rotation of the carrier 51' with respect to the axis of the rotary control shaft 80 since the axis of the rotary control shaft 80 is parallel to the longitudinal axis of the arcuate slot 85. The pin 86 is tubular to provide access for the control wires 87 from the rotary control 81. It should be also noted that since means 84 are provided to prevent rotation of the carrier 51' with respect to the axis of the control shaft 80, the magnet 59' need not be annular or continuous around the entire circumference of the carrier 51'. It may, for example, be segmented into separate generally square but slightly curved sections 59', one section 59' being supplied for each saturable core 60.

In the above described embodiments, the magnet has been fixed to the carrier and the cores have been fixed to the reference frame. But it is evident that the positions of the cores and the magnet may be interchanged. In fact, if the magnet is segmented (e.g., as in FIG. 12) some of the cores may be secured to the carrier and the others may be secured to the reference frame, the cores secured to the carrier being adjacent to magnet sections secured to the reference frame. Moreover, other kinds of contactless sensors could be used in lieu of the magnet and core combination. A light emitter such as an edge-illuminated sheet of lucite, for example, could be substituted for the magnet (20 FIG. 1) and the pairs of cores (21a, b), (21b, c) could be replaced by two light sensing linear CCD arrays, such as part No. CCD111ADC, a 256 element sensor manufactured by Fairchild Corp. A sensor array is advantageous in providing a digital output referenced to the stable physical locations of the array elements. Linear arrays of Hall effect magnetic sensors could be directly substituted for the pairs of saturable cores if and when such arrays become commercially available. The linear array, in other words, is a linear sensor responsive to the edge portion of a source of light or magnetic field that overlaps or excites a portion of the array.

In view of the foregoing, it is seen that by eliminating the need for mechanical components to resolve the displacement of a carrier into independent orthogonal linear displacements, multi-directional controllers can be manufactured having only one moving part so that the controller is rugged, reliable and economical to manufacture. Linear outputs having infinite resolution are provided by sensing the differential saturation of pairs of cores induced by relative displacement of a magnet with respect to the cores. Moreover, embodiments have been disclosed having at least three axes or orthogonal directions of control. The additional axes or directions of control are obtained by flexibly connecting the manipulator to the carrier and providing means for sensing the movement of the manipulator with respect to the carrier about the additional axes or directions of control. Moreover, a contactless controller has been disclosed having the polarity of the indication for one direction of control selected by another direction of control.

What is claimed is:

1. A contactless, multi-directional controller of the kind having a reference frame and a carrier, means for guiding the carrier with respect to the reference frame in first and second generally orthogonal directions while restraining motion of the carrier with respect to the reference frame in a third generally orthogonal direction, manipulator means attached to the carrier for manually positioning the carrier with respect to the reference frame in the first and second directions, and contactless sensing means comprising carrier-based means fixed to the carrier and reference-based means fixed to the reference frame, the carrier-based means being adjacent the reference-based means along the third direction, wherein the sensing means comprise first sensing means for sensing the displacement of the carrier with respect to the reference frame in the first direction, and second sensing means for sensing the displacement of the carrier with resect to the reference frame in the second direction, wherein the improvement comprises,
said carrier and frame are generally cylindrical, said carrier is telescopingly received in said frame, the first and second directions are the axial and circumferential directions of the cylinder of the carrier, and the third direction is the radial direction of the cylinder of the carrier; and
said sensing means comprise at least one magnet and at least two pairs of magnetically saturable cores overlapped by said magnet, each pair of said cores being associated with a respective one of the two directions, the proportional part of each core that is saturated sensing the displacement of the carrier along the associated direction.

2. The combination as claimed in claim 1, wherein the number of saturable cores associated with each of the first and second directions is two, the two cores associated with each direction undergoing differential saturation upon displacement of the carrier with respect to the reference frame in the associated direction.

3. A contactless multi-directional controller comprising a planar frame having an aperture, a planar carrier disposed generally parallel to the frame on a first side of the frame, a manipulator disposed on the opposite, second side of the frame and connected through said aperture to the carrier for permitting manual displacement and positioning of the entire carrier with respect to the frame along each of two orthogonal directions parallel to the plane of the frame and carrier within limits defined by said aperture, magnet means connected to the carrier for establishing a magnetic field responsive to the changes in relative position of the magnet means, and saturable core means connected to the frame for sensing the linear displacement of the carrier with respect to the frame along each of the two orthogonal directions parallel to the plane of the frame and carrier, wherein the saturable core means includes a pair of elongated saturable cores aligned with each of the two orthogonal directions and being overlapped by said magnet means, so that the portion of each core being overlapped and saturated by said magnet means is responsive to the displacement of the carrier along the orthogonal direction aligned with the core, and further comprising mechanical guiding means inserted between the frame and carrier for preventing rotation of the carrier with respect to the frame, wherein the manipulator is journaled to the carrier for rotation with respect to the carrier about an axis perpendicular to the first and second directions, and further comprising means for sensing the rotation of the manipulator with respect to the carrier.

4. A contactless controller of the kind having a reference frame and a carrier, means for guiding the carrier with respect to the reference frame in first and second generally orthogonal directions while restraining motion of the carrier with respect to the reference frame in a third generally orthogonal direction, manipulator means fixed to the carrier for manually positioning the carrier with respect to the reference frame in the first and second directions, and contactless sensing means comprising carrier-based means fixed to the carrier and reference-based means fixed to the reference frame, wherein the improvement comprises,
said manipulator means provides means for permitting manual displacement and positioning of the entire carrier with respect to the frame along each of the first and second orthogonal directions,
said sensing means comprise means for sensing the linear displacement of the entire carrier with respect to the reference frame in the first direction including at least one magnet means and at least two saturable cores overlapped by said magnet, the proportional part of each core that is saturated sensing the linear displacement of the entire carrier along said first orthogonal direction, and
wherein said magnet means provides means for reversing the polarity of the displacement indication of said means for sensing the linear displacement of the entire carrier with respect to the reference frame in said first orthogonal direction in response to linear displacement of the entire carrier along said second orthogonal direction.

5. The combination as claimed in claim 4, wherein said means for sensing the displacement of the carrier with respect to the reference frame in the first direction comprise a pair of said cores being differentially saturated by the displacement of said magnet with respect to the cores in the first direction, and wherein motion of the carrier in the second direction causes the previously saturated portions of the cores to become unsaturated and the previously unsaturated portions of the cores to become saturated.

6. The combination as claimed in claim 4, further comprising means for preventing polarity reversal when the sensing means indicates a substantial displacement from a central position.

* * * * *